United States Patent [19]

Kondou

[11] 4,306,199
[45] Dec. 15, 1981

[54] PUSH-PULL AMPLIFIER

[75] Inventor: Hikaru Kondou, Zama, Japan

[73] Assignee: Victor Company of Japan, Ltd., Kanagawa, Japan

[21] Appl. No.: 58,181

[22] Filed: Jul. 17, 1979

[30] Foreign Application Priority Data

Jul. 24, 1978 [JP] Japan .................................. 53-90296
Oct. 30, 1978 [JP] Japan ................................ 53-133568

[51] Int. Cl.³ .............................................. H03F 3/30
[52] U.S. Cl. ...................................... 330/268; 330/274
[58] Field of Search ............... 330/267, 268, 273, 274, 330/265, 270, 271

[56] References Cited

U.S. PATENT DOCUMENTS 3,995,228 11/1976 Pass .................................. 330/268 X Primary Examiner—James B. Mullins
Attorney, Agent, or Firm—Haseltine and Lake

[57] ABSTRACT

A push-pull amplifier comprises first and second output circuits each comprising at least one transistor which circuits are mutually connected in push-pull configuration, first and second detection circuits for respectively detecting the differences between the input and output voltages of the first and second output circuits, and first and second variable bias circuits operating in response to the detection outputs of the first and second detection circuits, respectively, to apply constant bias voltages to the transistors of the first and second output circuits in the case where the absolute values of the output currents of the first and second output circuits are below a specific level and to apply, as bias voltages, voltages equal to the sums of the constant bias voltages and voltages corresponding to the detection outputs of the first and second detection circuits to the first and second output circuits in the case where the absolute values of the output currents are above a specific level. The transistors of the first and second output circuits continually operate in their active areas.

6 Claims, 9 Drawing Figures

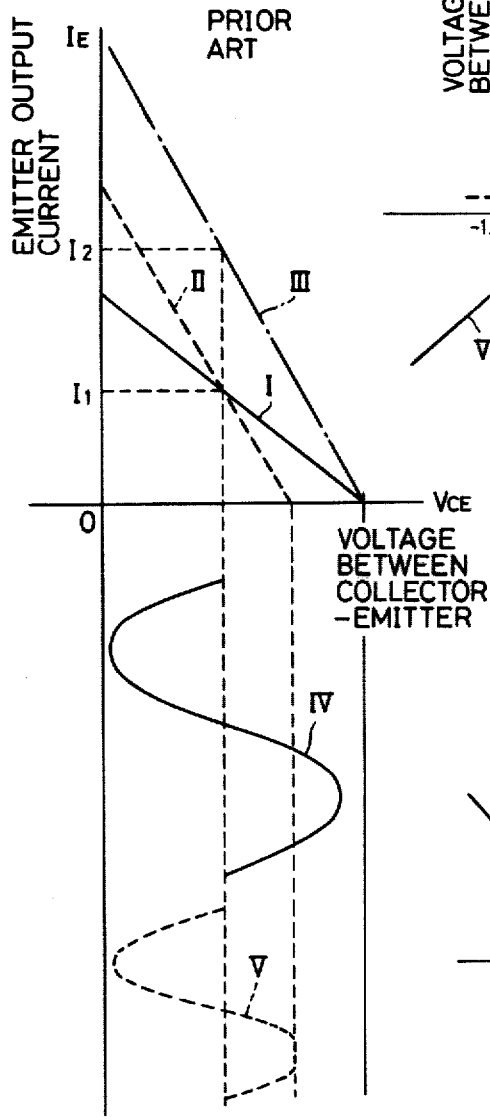
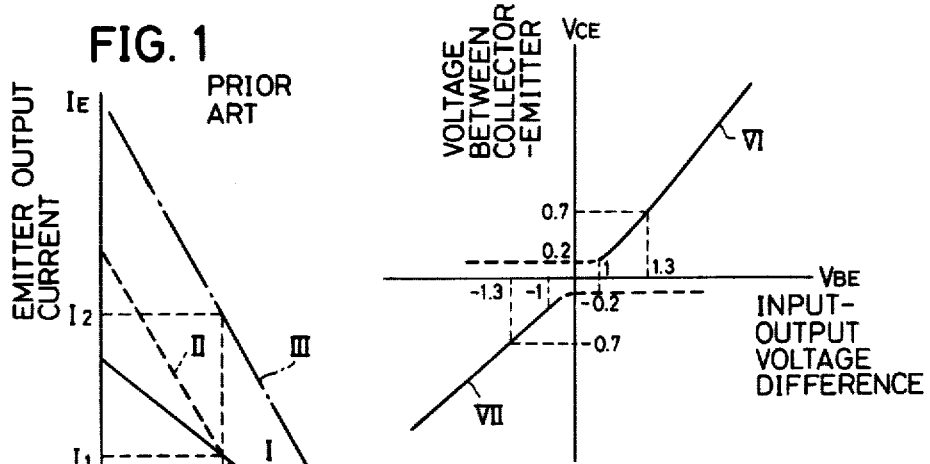
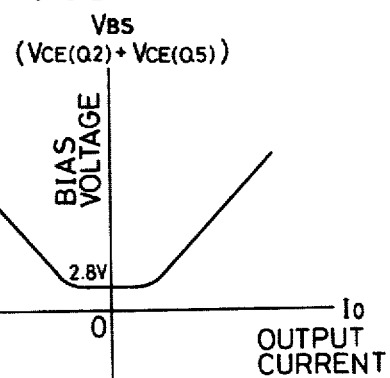

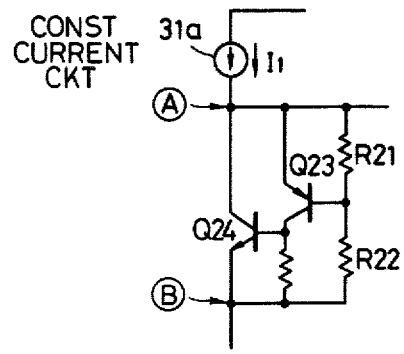
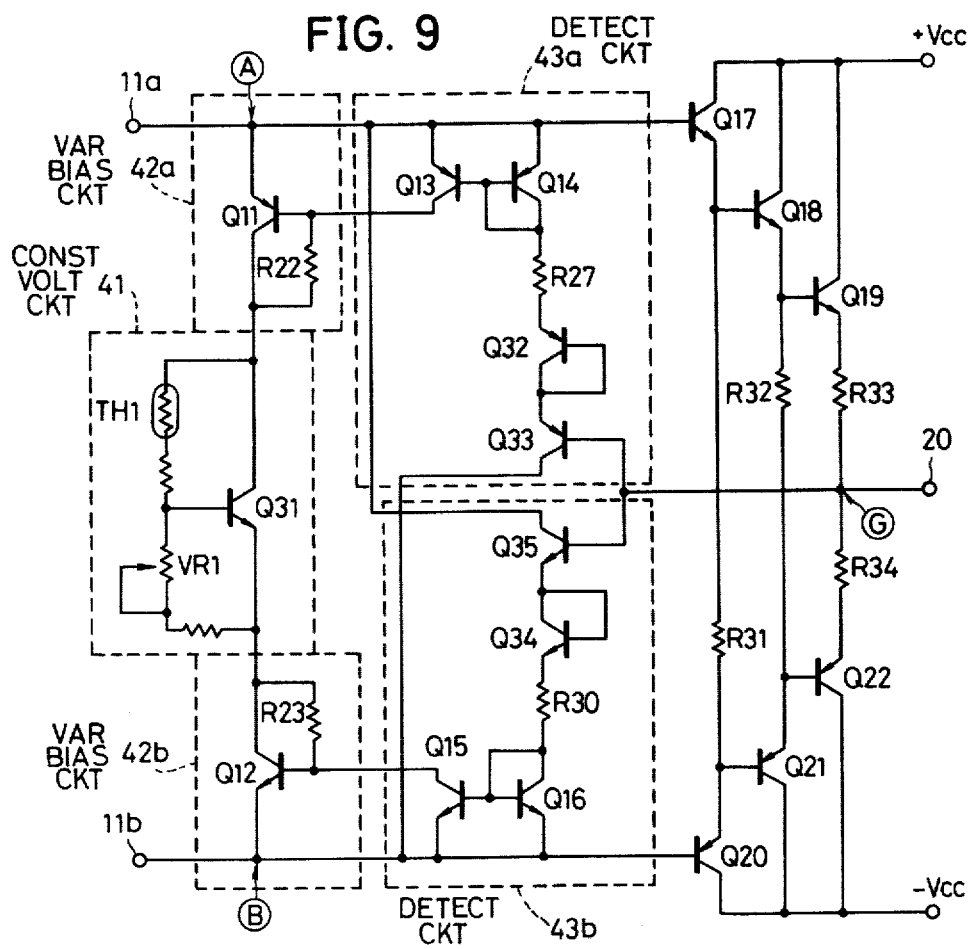

PUSH-PULL AMPLIFIER

BACKGROUND OF THE INVENTION

The present invention relates generally to push-pull amplifiers, and more particularly to a push-pull amplifier which operates with high efficiency, produces an output of low distortion factor, and carries out improved class "A" amplifier operation.

In general, amplifiers are classified as class "A", class "AB", class "B", etc., depending on the manner in which their operating points are selected. Of these amplifiers, a class "A" amplifier has an operating point which is set at substantially the middle of the linear part of the input voltage versus output current characteristic curve of the output-stage transistors. For this reason, a class "A" amplifier has the characteristic of a very low distortion but, on the other hand, has certain drawbacks such as the necessity of passing therethrough an idling current even when there is no signal, whereby the efficiency is poor, and a great quantity of heat is generated. In the case of an ordinary class "A" amplifier of 100 W output, for example, the power-source voltage is set at ±50 V, and the idling current is set at a value of the order of 4 A. Consequently, at the time when there is no signal, a power of 400 W is consumed. For this reason, a great quantity of heat is generated in a class "A" amplifier, which necessitates elaborate means for dissipating the heat, giving rise to problems such as high cost, increased weight, and difficulty in miniaturization.

Furthermore, the idling current of a class "A" amplifier is determined with consideration given to the estimated minimum value of the load impedance (for example, 4Ω). For this reason, in the case where the amplifier is used with a load impedance higher than this, there has been a disadvantage in efficiency as described hereinafter. Still another problem is that, when an output exceeding the rated value is produced by a conventional class "A" amplifier, its operation becomes one of class "AB", and switching distortion arises.

In the case of a class "AB" amplifier, the idling current is less than that of a class "A" amplifier, while in the case of a class "B" amplifier, the idling current is theoretically zero. In both of these amplifiers, the efficiency is higher than that in a class "A" amplifier, and less heat is generated. On the other hand, however, the output-stage transistors of the class "AB" and class "B" push-pull amplifiers are caused to undergo switching operation. For this reason, switching distortion is produced in their outputs, and the distortion factor is worse than that in a class "A" push-pull amplifier.

SUMMARY OF THE INVENTION

Accordingly, it is a general object of the present invention to provide a novel and useful push-pull amplifier in which the above described problems accompanying known push-pull amplifiers have been overcome.

Another and specific object of the invention is to provide a push-pull amplifier which, strictly speaking, does not belong to any of the above described class "A", class 37 AB", and class "B" of the prior art but carries out an improved class "A" operation, as it were, of a novel operational mode.

Still another object of the invention is to provide a push-pull amplifier of a circuit organization wherein the bias voltage of the output-stage transistors is maintained constant when the output is in a range below a specific value, and, when the output is above a specific value, the bias voltage is varied in response to that output. The amplifier of the present invention has the advantageous features of its carrying out improved class "A" operation, very low idling current resulting in good operational efficiency, and, moreover, very low distortion factor of the output resulting from absence of distortions such as switching distortion and crossover distortion.

Other objects and further features of the invention will be apparent from the following description with respect to preferred embodiments of the invention when read in conjunction with the accompanying drawings.

BRIEF DESCRIPTION OF THE DRAWINGS

In the drawings:

FIG. 1 is a graph indicating characteristics for a description of the operation of a known class "A" amplifier;

FIG. 3 is a graph indicating relationships between the difference between the input voltage and the output voltage of the output-stage transistors in the circuit shown in FIG. 2 and the voltage between the collector and the emitter of a transistor for varying bias voltage;

FIG. 4 is a graph indicating the relationship between the output current and a bias voltage of the circuit illustrated in FIG. 2;

FIG. 8 is a partial circuit diagram showing a modification of one part of the circuit shown in FIG. 7; and FIG. 9 is a circuit diagram of a third embodiment of the push-pull amplifier according to the invention.

DETAILED DESCRIPTION

As conducive to a full understanding of the present invention, the idling current of a known class "A" amplifier will first be described briefly in conjunction with FIG. 1. The abscissa of FIG. 1 represents the voltage $V_{CE}$ between the collector and the emitter of an output-stage transistor of the amplifier, while the ordinate represents the emitter output current $I_E$ of the transistor.

In the case of a load impedance of 8Ω, the optimum load line for obtaining the output waveform indicated by solid line IV becomes as indicated by solid line I. The idling current in this case assumes a value as indicated at $I_1$. The load line of a load impedance of 4Ω when the idling current is of the value $I_1$ becomes as indicated by intermittent line II. For this reason, the output waveform at this time becomes distorted as indicated by intermittent line V, and the input waveform is no longer reproduced accurately. Therefore, it has been the practice in the known class "A" amplifier to set the idling current at an idling current $I_2$ determined by the optimum load line of the estimated lowest load impedance of 4Ω indicated by the single-dot chain line III. When the amplifier is used for a load of 8Ω, however, this practice is disadvantageous on the point of efficiency.

Accordingly, the present invention provides a push-pull amplifier which has a good distortion factor of the same order as that of a class "A" amplifier and, moreover, is capable of operating with a high efficiency close to that of a class "AB" or class "B" amplifier.

Figure 2:
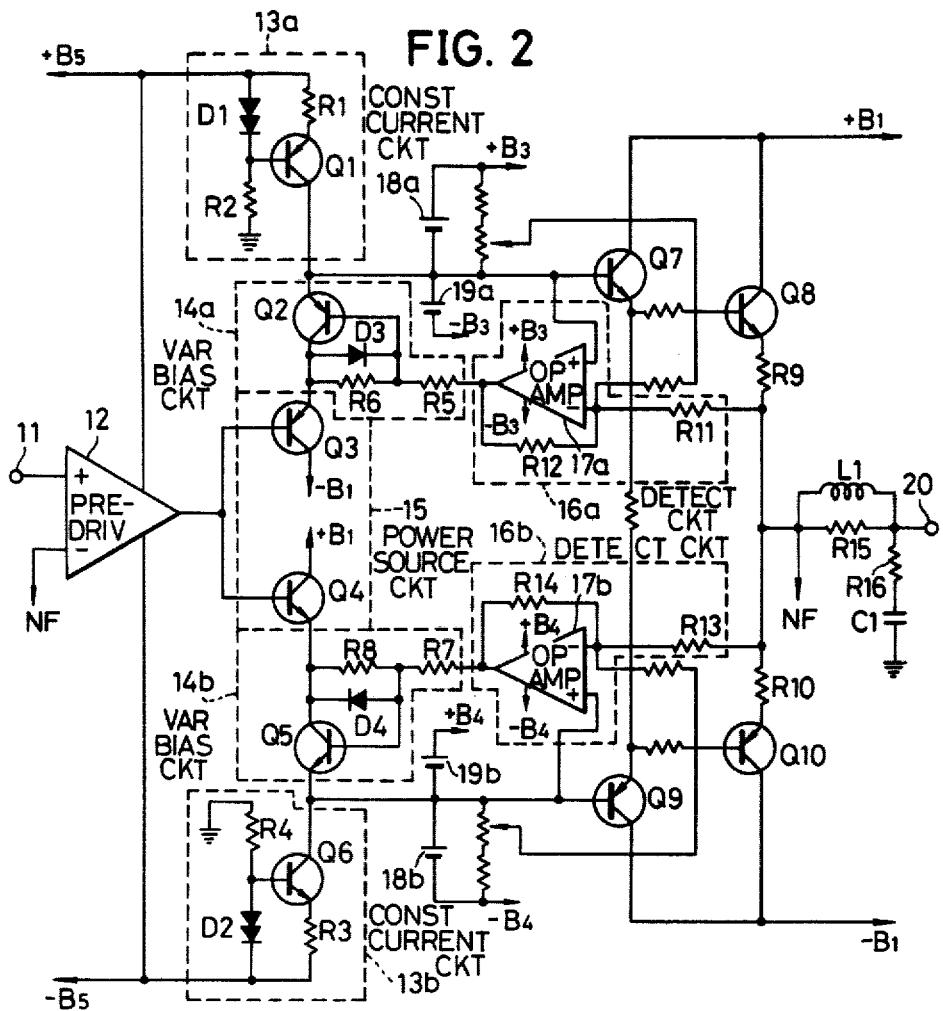
FIG. 2 is a circuit diagram of a first embodiment of the push-pull amplifier according to the present invention.

Referring first to FIG. 2, the first embodiment of the push-pull amplifier according to the invention will now be described. An audio signal applied to an input terminal 11 is amplified by a predriver circuit 12 and is thereafter led out through the emitters of transistors Q2 and Q5. The signal led out through the emitter of the transistor Q2 is applied to the base of a transistor Q7 and, at the same time, is applied to the noninverting input terminal of an operational amplifier 17a. Similarly, the signal led out through the emitter of the transistor Q5 is applied to the base of a transistor Q9 and, at the same time, is applied to the noninverting input terminal of an operational amplifier 17b.

A constant-current circuit 13a comprising a PNP transistor Q1, resistors R1 and R2, and a diode D1 is connected to the emitter of the transistor Q2. Similarly, a constant-current circuit 13b comprising an NPN transistor Q6, resistors R3 and R4, and a diode D2 is connected to the emitter of the transistor Q5. The PNP transistor Q2, a diode D3, and resistors R5 and R6 constitute a variable-bias circuit 14a. The forward-direction diode D3 and the resistor R6 are connected in parallel between the collector and base of the transistor Q2. The resistor R5 is connected in series with the resistor R6. The NPN transistor Q5, a diode D4, and resistors R7 and R8 constitute a variable bias circuit 14b. The reverse-direction diode D4 and the resistor R8 are connected in parallel between the collector and base of the transistor Q5. The resistor R7 is connected in series with the resistor R8. Here, the above mentioned resistors R5, R6, R7, and R8 are selected to have the same resistance value.

A PNP transistor Q3, an NPN transistor Q4, and power sources −B and +B1 connected respectively to the collectors of these transistors constitute a power source circuit 15. The NPN transistor Q7 and an NPN transistor Q8 and the PNP transistor Q9 and a PNP transistor Q10 are respectively connected to form Darlington Pairs and constitute output stages. The emitters of the transistors Q8 and Q10 are connected by way of resistors R9 and R10, and the output stage is constituted as a pure complementary push-pull organization. The junction between the resistors R9 and R10 is connected respectively to resistors R11 and R13.

A detection circuit 16a comprises an operational amplifier 17a whose noninverting input terminal is connected to the resistor R11, and between whose output and noninverting input a resistor R12 is connected. Similarly, a detection circuit 16b comprises an operational amplifier 17b whose noninverting input terminal is connected to the resistor R13, and between whose output and noninverting input a resistor R14 is connected. Specific DC voltages are applied from DC voltage sources 18a and 19a and DC voltage sources 18b and 19b respectively to the two input terminals of these operational amplifiers 17a an 17b. Here, the resistance values of the resistors R12 and R14 are selected to equal those of the resistors R11 and R13.

The output produced at the junction of the resistors R9 and R10 is passed through a filter comprising a coil L1, a capacitor C1, and resistors R15 and R16 and is led out through an output terminal 20.

The emitter outputs of the transistors Q8 and Q10 are respectively passed through the resistors R9 and R11 and the resistors R10 and R13 and applied to the inverting input terminals of the operational amplifiers 17a and 17b. The operational amplifier 17a detects the voltage difference between the base voltage of the transistor Q7 and the emitter voltage of the transistor Q8, that is, the voltage difference between the input voltage and the output voltage of the output-stage transistors Q7 and Q8. The voltage difference detection signal of the operational amplifier 17a is applied via the resistor R5 to the base of the transistor Q2. Similarly, the operational amplifier 17b detects the voltage difference between the base voltage of the transistor Q9 and the emitter voltage of the transistor Q10, that is, the voltage difference between the input voltage and the output voltage of the output-stage transistors Q9 and Q10. The voltage difference detection output of the operational amplifier 17b is applied by way of the resistor R7 to the base of the transistor Q5.

Then, when the voltage difference between the base voltage of the transistor Q7 and the emitter voltage of the transistor Q8 becomes large, the voltage difference detection output voltage from the operational amplifier 17a corresponding to this voltage difference becomes high, whereby the diode D3 becomes nonconductive, and the voltage between the collector and emitter of the transistor Q2 rises in response to the base input voltage thereof. Conversely, when the voltage difference between the base voltage of the transistor Q7 and the emitter voltage of the transistor Q8 becomes small, for example, of an order of one volt or less, the voltage difference detection voltage produced in response thereto as output from the operational amplifier 17a becomes low, whereby the diode D3 becomes conductive ("ON"). Accordingly, in the case where a silicon transistor is used for the transistor Q2 an a germanium diode is used for the diode D3, the voltage between the collector and emitter of the transistor Q2 becomes a voltage value of 0.2 V which results from the subtraction of the voltage drop of 0.5 V in the forward direction of the diode D3 from the threshold-value voltage of 0.7 V of the transistor Q2.

Furthermore, since the constant-current circuit 13a is connected to the emitter of the transistor Q2, and the emitter current thereof is a constant current, the transistor Q2 assumes a cut-off state. In addition, since the diode D3 is connected thereto, the transistor Q2 does not assume a fully saturated state, and the voltage between its collector and emitter does not become lower than 0.2 V. Therefore, the output-stage transistors Q7 and Q8 never assume a cut-off state.

Accordingly, the difference $V_{BE}$ between the input and output voltages of the output-stage transistors Q7 and Q8 and the voltage $V_{CE}$ between the collector and emitter of the transistor Q2 have a relationship as indicated by curve VI in FIG. 3. Similarly, the difference $V_{BE}$ between the input and output voltages of the output-stage transistors Q9 and Q10 and the voltage $V_{CE}$ between the collector and emitter of the transistor Q5 have a relationship as indicated by curve VII in FIG. 3 when the collector voltage of the transistor Q5 is taken as a reference datum.

Accordingly, the sum $(V_{CE(Q2)}+V_{CE(Q5)})$ of the voltage difference (bias voltage) $V_{BS}$ between the emitter of the transistor Q2 and the emitter of the transistor Q5, that is, the voltage $V_{CE(Q2)}$ between the collector and emitter of the transistor Q2 and the voltage $V_{CE(Q5)}$ between the collector and emitter of the transistor Q5 has a relationship with respect to the output current $I_O$ of the output terminal 20 as indicated in FIG. 4. More specifically, the bias voltage $V_{BS}$ is of a constant value of 2.8 V when the amplitude of the output current $I_O$ is below a certain value. When the amplitude of the output current $I_O$ exceeds a certain value, the bias voltage $V_{BS}$ assumes a value resulting from a smooth addition of the variation of the difference between the input and output voltages of the output-stage transistors to the above mentioned constant voltage. Therefore, even when the output is high, the output-stage transistors Q7, Q8, Q9, and Q10 are not cut off and operate in only their active area.

Figure 5:
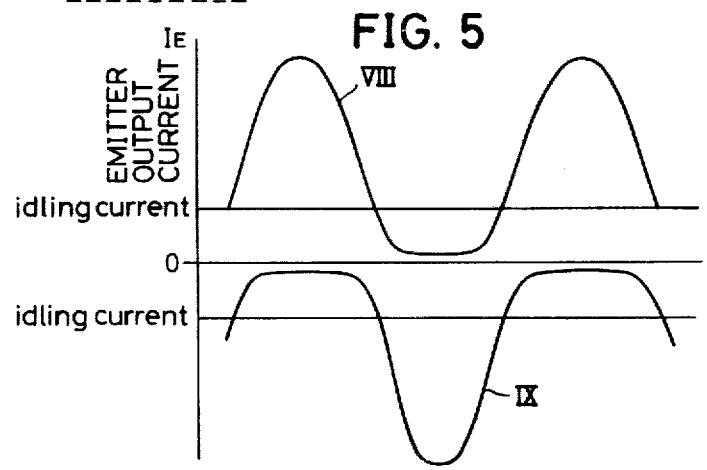
FIG. 5 is a waveform chart showing waveforms of the output current of the circuit shown in FIG. 2.

The waveforms of the emitter output current $I_E$ of the transistors Q8 and Q10 (that is, the output current $I_O$) at the time of large amplitude are indicated in FIG. 5. Curve VIII indicates the output current waveform of the emitter of the transistor Q8, while curve IX indicates the output current waveform of the emitter of the transistor Q10. For comparison, the output current waveforms of a known push-pull amplifier of class "B" are shown in FIG. 6.

Figure 6:
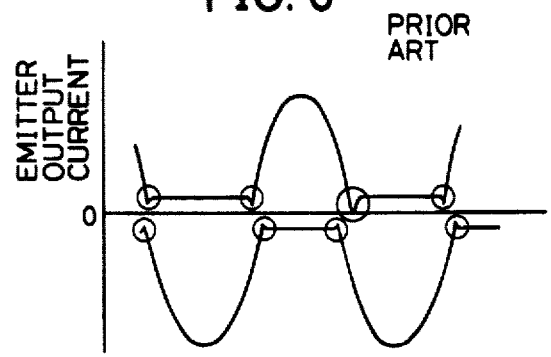
FIG. 6 is a waveform chart showing the waveform of the output current of a known class "B" push-pull amplifier.

As is apparent from FIG. 6, in the known class "B" push-pull amplifier, switching distortion portions (encircled portions) are produced at parts where the transistors undergo switching (cut-off). In contrast, according to the push-pull amplifier of the present invention, in the half cycle on the negative side of the emitter output current of the transistor Q8 and the half cycle on the positive side of the emitter output current of the transistor Q10, when a certain constant value is exceeded, the emitter output currents are gently limited to constant values by the diode characteristics of the diodes D3 and D4. Thus, as is apparent from a comparison of FIGS. 5 and 6, switching distortion such as that produced in the known push-pull amplifier is not generated in the push-pull amplifier of the present invention. Furthermore, since the connecting parts of the upper and lower output waveforms is smooth, there is no cross-over distortion in the combined output waveform.

A further feature of the push-pull amplifier of the invention is that the entire cycle of the input is not amplified as it is, as in a known class "A" push-pull amplifier, but the half cycles on the negative side or the positive side of the output currents of the NPN transistors Q7 and Q8 and the PNP transistors Q9 and Q10 of the output stage are limited in amplitude to constant values, whereby each idling current is of a very low value of 0.3 A, for example. Therefore, in the amplifier of the present invention, only a very small quantity of heat is generated, and the efficiency is much higher than that of a known class "A" amplifier and is comparable to the efficiency of a known class "B" amplifier.

In the above described embodiment of the invention, Schottky diodes may be used for the diodes D3 and D4. Furthermore, field-effect transistors of different channels may be used instead of bipolar transistors.

Figure 7:
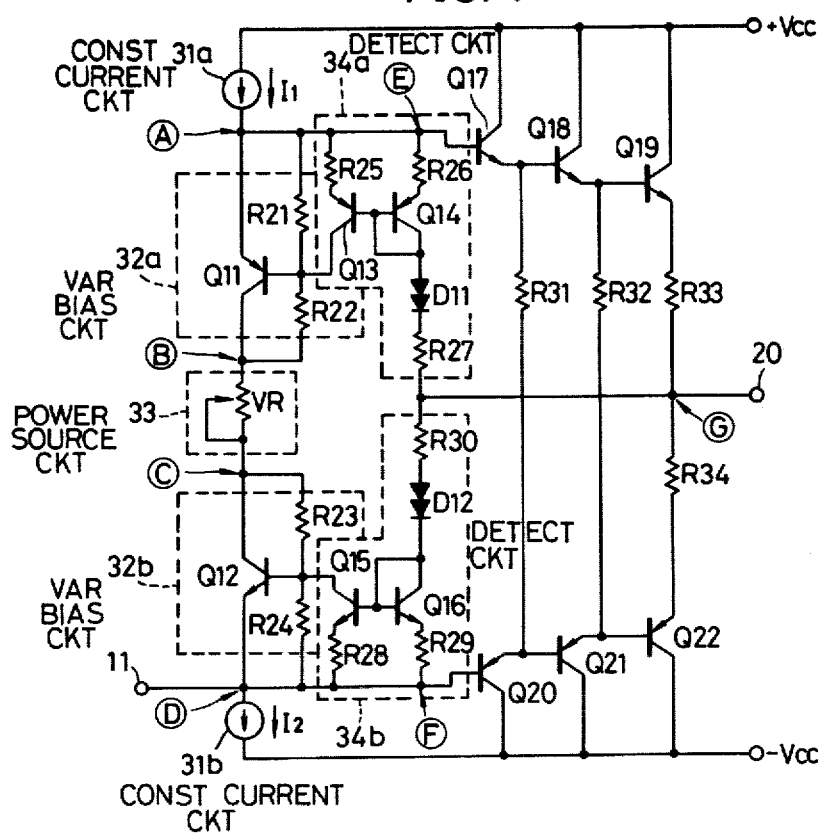
FIG. 7 is a circuit diagram of a second embodiment of the push-pull amplifier according to the invention.

Next, the second embodiment of the push-pull amplifier according to the present invention will be described with reference to FIG. 7. In this circuit, there are provided two constant-current sources 31a and 31b, between which a variable-bias circuit 32a comprising a PNP transistor Q11 and resistors R21 and R22 for base bias thereof, a power source circuit 33 comprising a variable resistor VR for idling current adjustment, and a variable-bias circuit 32b comprising an NPN transistor Q12 and base-bias resistors R23 and R24 thereof are connected in series.

Detection circuits 34a and 34b are respectively connected to the variable-bias circuits 32a and 32b. The detection circuit 34a comprises PNP transistors Q13 and Q14, resistors R25, R26, and R27, and a diode D1. The bases of the transistors Q13 and Q14 are connected to each other, and their junction is connected to the collector of the transistor Q14. The emitters of the transistors Q13 and Q14 are respectively connected through the resistors R25 and R26 to a point Ⓐ on the emitter side of the transistor Q11. The collector of the transistor Q13 is connected to the base of the transistor Q11. The diode D11 and the resistor R27 are connected in series to the collector of the transistor Q14. The transistors Q13 and Q14 and the resistors R25 and R26 constitute a current mirror circuit. The detection circuit 34b has a circuit organization similar to that of the detection circuit 34a, comprising NPN transistors Q15 and Q16, resistors R28, R29, and R30, and a diode D12. The transistors Q15 and Q16 and the resistors R28 and R29 constitute a current mirror circuit.

The emitters of the transistors Q13 and Q14 are connected by way of the resistors R25 and R26 to the base of a transistor Q17. Output-stage transistors Q17, Q18, and Q19 are connected in Darlington arrangement. Similarly the emitters of the transistors Q15 and Q16 are connected by way of the resistors R28 and R29 to the base of a transistor Q20. Output-stage transistors Q20, Q21, and Q22 are connected in Darlington arrangement. The output-stage transistors Q17 through Q22 constitute a pure-complementary, single-ended push-pull circuit. The emitters of the transistors Q17 and Q18 are respectively connected by way of resistors R31 and R32 to the emitters of the transistors Q20 and Q21. The emitters of the transistors Q19 and Q22 are respectively connected by way of resistors R33 and R34 and a point Ⓖ to an output terminal 20. The connection point Ⓖ is connected to the resistors R27 and R30.

In the present embodiment of the invention, the resistance values of the resistors R21 through R30 are selected to have the following relationships.

2R21=R22,
R23=2R24,
R22=R27
R25=R26,
R23=R30,
R28=R29

Here, for the sake of simplification of description, it will be assumed that the threshold voltages between the bases and emitters of the transistors Q11 through Q22 are all equal and are of a value $V_{BES}$, and that the emitter-grounded DC current amplification factor $h_{FE}$ of the transistors Q11 and Q12 is of such an amply great value that the base current can be neglected. Then, the variable resistor VR is so adjusted that the idling currents flowing through the resistors R33 and R34, when there is no signal, will be of low values such that the voltage drop due to the resistors R33 and R34 can be neglected. As a result, the currents flowing through the transistors Q13, Q14, Q15, and Q16 become substantially zero, whereby the voltage between the emitter and collector of the transistor Q11 (between points Ⓐ and Ⓑ) and the voltage between the collector and emitter of the transistor Q12 (between the points Ⓒ and Ⓓ) are of mutually equal value of 3 $V_{BES}$.

On the other hand, the voltage between the points Ⓔ and Ⓖ is of a value of 3 $V_{BES}$ due to the transistors Q17, Q18, and Q19 connected in a 3-stage Darlington arrangement. Furthermore, the voltage drop in the forward direction of the transistor Q14 and the diode D1 is also 3 $V_{BES}$. Similarly, the voltage between the points Ⓕ and Ⓖ is also 3 $V_{BES}$. At this time, each of the output-stage transistors Q17 through Q19 and Q20 through Q22 operates in its active area.

Then, when an input signal is applied to the input terminal 11 connected to the point Ⓓ, a current resulting from the addition of a current of a certain value by this input signal to the idling current flows out through the output terminal 20. During the period in which this current thus flows out, the potential difference between the input and output of the output-stage transistors Q17, Q18, and Q19 (i.e., the voltage difference between the points Ⓔ and Ⓖ increase, relative to the value of 3 $V_{BES}$ at the time when there is no signal, by an incremental quantity equal to the sum of the voltage drop due to the resistor 33 and the increase increment of the voltage between the bases and emitters of the output-stage transistors Q17, Q18, and Q19.

This voltage increase increment appears also between the two terminals of the resistor R27 since the resistance values of the resistors R25 and R26 are selected at low values of an order such that they can be neglected in comparison with the resistance value of the resistor R27. In addition, because of the current mirror circuit comprising the transistors Q13 and Q14, the collector currents of these transistors Q13 and Q14 are substantially equal, and, furthermore, a constant current $I_1$ from the constant-current source 31a is flowing through the resistor R21. For this reason, the above mentioned voltage increase increment appears also at the two terminals of the resistor R22. Consequently, the voltage between the points Ⓐ and Ⓑ increases by an increment substantially equal to the increase increment of the voltage between the points Ⓔ and Ⓖ.

At this time, the emitter output currents of the output-stage transistors Q20, Q21, and Q22 decrease, and the voltage difference between the points F and G decreases. However, the voltage between the collector and emitter of the transistor Q12 is maintained at substantially 3 $V_{BES}$ even when the currents flowing through the transistors Q15 and Q16 become zero, whereby the voltage between the points Ⓕ and Ⓖ also becomes substantially 3 $V_{BES}$, and the forward bias of the PNP transistors Q20, Q21, and Q22 is sustained. Therefore, the transistors Q20, Q21, and Q22 is not turned into cut-off state, whereby switching distortion is not produced.

On the other hand, during the period in which an output current flows in through the output terminal 20 in response to the input signal, the emitter output currents of the output-stage transistors Q20, Q21, and Q22 increase, conversely to the above described result. For this reason, the voltage difference between the input and output of the output-stage transistors Q20, Q21, and Q22 (i.e., between the points Ⓕ and Ⓖ increases, relative to the value of 3 $V_{BES}$ at the time where there is no signal, by an incremental quantity equal to the sum of the voltage drop due to the resistor R34 and the increase increment of the voltage between the bases and emitters of the output-stage transistors Q20, Q21, and Q22, and the voltage between the collector and emitter of the transistor Q12 increases by an incremental quantity substantially equal to this voltage variation. During this period, since the voltage between the points Ⓐ and Ⓑ is maintained substantially at 3 $V_{BES}$, the voltage between the points Ⓔ and Ⓖ decreases but becomes substantially 3 $V_{BES}$, and the output-stage transistors Q17, Q18, and Q19 sustain the forward bias.

In the circuit of the present embodiment of the invention, also, the output current waveform appearing at the point Ⓖ becomes as indicated in FIG. 5.

Instead of the transistor Q11 in the above described embodiment of the invention, transistors Q23 and Q24 connected as shown in FIG. 8 may be used. The emitter of the PNP transistor Q23 and the collector of the NPN transistor Q24 are connected to the constant current circuit 31a, and the collector of the transistor Q23 is connected to the base of the transistor Q24. This circuit is effective when used as a substitute in the case where the emitter-grounded DC current amplification factor $h_{FE}$ of the transistor Q11 in the above described embodiment of the invention is small, and the effect of the base current cannot be neglected. More specifically, almost all of the constant current $I_1$ flows throw the transistor Q24, and by causing the current flowing through the transistor Q23 to be amply small, the effect of the base current of the transistor Q23 on the voltage across the two terminals of the resistor R22 is removed. A similar circuit organization can be used also for the transistor Q12.

In the above described embodiment of the invention, the output-stage transistors are connected in three-stage Darlington arrangement, the threshold voltage $V_{BES}$ between the bases and emitters thereof being respectively equal, and the forward-direction voltage drop is also made equal to $V_{BES}$. For this reason, two diodes are used respectively for each of the diodes D11 and D12. However, in the case where different diodes of forward-direction voltage drop are used, the number of diodes is not limited to two. Furthermore, in the case where the output-stage transistors are arranged in a single stage, the diodes D11 and D12 are unnecessary. In addition, while the input terminal is connected to the emitter of the transistor Q2, it may be connected to any of the points Ⓐ, Ⓑ, and Ⓒ.

The third embodiment of the push-pull amplifier according to the invention will now be described in conjunction with FIG. 9. In FIG. 9, those parts which are the same as corresponding parts in FIG. 7 are designated by like reference numerals and characters. Description of such parts will be omitted.

This amplifier is provided with a constant-voltage circuit 41 which carries out setting of the idling currents and temperature compensation thereof, and which comprises a transistor Q31, a thermistor TH1 connected between the base and collector of the transistor Q31, and a variable resistor VR1 connected between the base and emitter of the transistor Q31. Another essential component of this amplifier is a variable-bias circuit 42a comprising a transistor Q11 whose collector is connected to the constant-voltage circuit 41 and a resistor R22 connected between the base and collector of this transistor Q11. Similarly, in symmetrical relation to the variable-bias circuit 42a, there is provided a variable bias circuit 42b comprising a transistor Q12 whose collector is connected to the constant-voltage circuit 41 and a resistor 23 connected to the constant-voltage circuit 41 and a resistor 23 connected between the base and collector of this transistor Q12. This amplifier is further provided with detection circuits 43a and 43b. The detection circuit 43a comprises transistors Q13 and Q14 constituting a current mirror circuit, a resistor 27, a diode connection transistor Q32, and an emitter-follower connection transistor Q33. Similarly, in symmetrical complementary relation to the detection circuit 43a, the detection circuit 43b comprises transistors Q15 and Q16 constituting a current mirror circuit, a resistor R30, a diode connection transistor Q34, and an emitter-follower connection transistor Q35.

The idling currents of the transistors Q19 and Q22 are set at a value, for example of 50 to 150 mA by the variable resistor VR1. The temperature characteristics thereof are compensated for by the thermistor TH1 and the transistor Q31. The currents flowing through the current mirror circuits comprising the transistors Q13 and Q14 and the transistors Q15 and Q16 when there is no input signal are almost zero.

It will be assumed here that there is a forward-direction input, whereby the currents of the output-stage NPN transistors Q17, Q18, and Q19 increase, and the voltage between the points A and G increases. The variation in the voltage between the bases and emitters of the transistors Q14, Q32, and Q33 will be denoted by $\Delta V_{BE}$. Then, the voltage variation $\Delta V_{B1}$ which results from the subtraction of $3\Delta V_{BE}$ from the voltage variation $\Delta V_{AG}$ between the points Ⓐ and Ⓖ is produced across the two terminals of the resistor R22, that is, between the collector and emitter of the transistor Q11. Therefore, as a result, the bias voltage between the points Ⓑ and Ⓒ is reduced by $3\Delta V_{BE}$, and the emitter output current waveforms of the transistors Q19 and Q22 become as indicated in FIG. 5. The operation of the circuit part of the remainder lower half of the figure is similar and, since it can be readily understood from the foregoing description, will not be further described.

Further, this invention is not limited to these embodiments but various variations and modifications may be made without departing from the scope of the invention.

What is claimed is:

1. A push-pull amplifier comprising:
   first and second output circuits each comprising at least one transistor, which circuits are mutually connected in push-pull arrangement;
   first and second detection circuits for respectively detecting the differences between the input and output voltages of the first and second output circuits, said first and second detection circuits respectively comprising operational amplifiers to whose noninverting input terminals the input voltages of the first and second output circuits are respectively applied, and to whose inverting input terminals the output voltages of the first and second output circuits are respectively applied; and
   first and second variable bias circuits operating, in response to the detection outputs of the first and second detection circuits, respectively, to apply constant bias voltages to the transistors of the first and second output circuits in the case where the absolute values of the output currents of the first and second output circuits are below a specific level, and to apply, as bias voltages, voltages equal to the sums of said constant bias voltages and voltages corresponding to the detection outputs of the first and second detection circuits to the first and second output circuits in the case where the absolute values of said output currents are above the specific level.

2. A push-pull amplifier comprising:
   first and second output circuits each comprising at least one transistor, which circuits are mutually connected in push-pull arrangement;
   first and second detection circuits for respectively detecting the differences between the input and output voltages of the first and second output circuits;
   first and second variable bias circuits operating, in response to the detection outputs of the first and second detection circuits, respectively, to apply constant bias voltages to the transistors of the first and second output circuits in the case where the absolute values of the output currents of the first and second output circuits are below a specific level, and to apply, as bias voltages, voltages equal to the sums of said constant bias voltages and voltages corresponding to the detection outputs of the first and second detection circuits to the first and second output circuits in the case where the absolute values of said output currents are above the specific level;
   first and second constant-current circuits respectively connected to the first and second variable bias circuits; and
   a constant-voltage circuit connected between the first and second variable bias circuit, said first and second variable bias circuits respectively comprising transistors whose emitters are respectively connected to the first and second constant-current circuits, and whose bases are respectively connected through resistors to the output sides of the first and second detection circuits, and diodes respectively connected between the bases and collectors of the transistors.

3. A push-pull amplifier comprising:
   first and second output circuits each comprising at least one transistor, which circuits are mutually connected in push-pull arrangement;
   first and second detection circuits for respectively detecting the differences between the input and output voltages of the first and second output circuits, said first and second detection circuits comprising a plurality of transistors mutually connected in a manner to constitute respective current mirror circuits, the emitters of the transistors being connected to the input sides of the first and second output circuits, the bases of the transistors being connected to the output sides of the first and second output circuits; and
   first and second variable bias circuits operating, in response to the detection outputs of the first and second detection circuits, respectively, to apply constant bias voltages to the transistors of the first and second output circuits in the case where the absolute values of the output currents of the first and second output circuits are below a specific level, and to apply, as bias voltages, voltages equal to the sums of said constant bias voltages and voltages corresponding to the detection outputs of the first and second detection circuits to the first and second output circuits in the case where the absolute values of said output currents are above the specific level.

4. A push-pull amplifier comprising:
   first and second output circuits each comprising at least one transistor, which circuits are mutually connected in push-pull arrangement;

first and second detection circuits for respectively detecting the differences between the input and output voltages of the first and second output ciucuits; and first and second variable bias circuits operating, in response to the detection outputs of the first and second detection circuits, respectively, to apply constant bias voltages to the transistors of the first and second output circuits in the case where the absolute values of the output currents of the first and second output circuits are below a specific level, and to apply, as bias voltages, voltages equal to the sums of said constant bias voltages and voltages corresponding to the detection outputs of the first and second detection circuits to the first and second output circuits in the case where the absolute values of said output currents are above the specific level, the first detection circuits comprising a first PNP transistor, a second PNP transistor whose base is connected to the collector thereof and to the base of the first PNP transistor, the emitters of the first and second PNP transistors being connected to the input side of the first output circuits, the first and second PNP transistors constituting a current mirror circuit, and first resistor connected between the bases of the first and second PNP transistors and the output side of the first output circuit, the second detection circuit comprising a first NPN transistor, a second NPN transistor whose base is connected to the collector thereof and to the base of the first NPN transistor, the emitters of the first and second NPN transistors being connected to the input side of the second output circuit, the first and second NPN transistors constituting a current mirror circuit, and a second resistor connected between the bases of the first and second NPN transistors and the output side of the second output circuit, the first variable bias circuit comprising a third PNP transistor whose emitter is connected to the input side of the first output circuit, and whose base is connected to the collector of the first PNP transistor, and a third resistor connected between the base and collector of the third PNP transistor, the second variable bias circuit comprising a third NPN transistor whose emitter is connected to the input side of the first output circuit, and whose base is connected to the collector of the first NPN transistor, and a fourth resistor connected between the base and collector of the third NPN transistor.

5. A push-pull amplifier as claimed in claim 4 in which the first detection circuit further comprises a first diode circuit connected in series with the first resistor connected to the bases of the first and second PNP transistors, and the second detection circuit further comprises a second diode circuit connected in series with the second resistor connected to the bases of the first and second NPN transistors.

6. A push-pull amplifier comprising:

a first group of transistors which are arranged to form a compound connection;

a second group of transistors which have a conduction type complementary to that of the first group of transistors and are arranged to form the compound connection so as to make a pair with the first group of transistors; wherein the emitters of the last stage transistors of the first and the second group are connected to a common output terminal via a first and second resistor respectively;

a first and second detection circuit for detecting a potential difference between the input of the first group of transistors and the common output terminal and a potential difference between the input of the second group of transistors and the commmon output terminal respectively, said first and the second detection circuit respectively comprising a plurality of semi-conductor elements and at least one resistor which are serially connected between the respective inputs of the first and the second group of transistors and the common output terminal, wherein the number of semi-conductor elements equals to the number of the transistors of each of the first and the second group;

a first and second variable bias circuit which are serially connected between the inputs of the first and the second group of transistors, and which supply variable forward bias voltages to the inputs of the first and the second group of transistors in response to the detection outputs of the first and the second detection circuit respectively, said first and the second variable bias circuit supplying to the first and the second group of transistors predetermined bias voltages which are substantially equal to the threshold voltage of a semi-conductor element multiplied by a factor, in the absence of an input signal which is applied to the inputs of the first and the second group of transistors; and a first and second control means for controlling the first and the second variable bias circuit to apply to the inputs of the first and the second group of transistors forward bias voltages corresponding to a sum of the predetermined forward bias voltage and a voltage drop across the at least one resistor which is caused by the presence of the input signal, respectively.

* * * * *